United States Patent [19]

Boomer

[11] Patent Number: 5,218,239
[45] Date of Patent: Jun. 8, 1993

[54] SELECTABLE EDGE RATE CMOS OUTPUT BUFFER CIRCUIT

[75] Inventor: James B. Boomer, Falmouth, Me.

[73] Assignee: National Semiconductor Corporation, Santa Clara, Calif.

[21] Appl. No.: 771,391

[22] Filed: Oct. 3, 1991

[51] Int. Cl.$^5$ ............... H03K 17/16; H03K 19/20
[52] U.S. Cl. .................. 307/443; 307/451; 307/263; 307/542; 307/599
[58] Field of Search ........... 307/443, 448, 451, 475, 307/465, 468, 469, 270, 542, 549, 550, 592, 599, 597, 572, 573, 576, 463

[56] References Cited

U.S. PATENT DOCUMENTS

| | | | |
|---|---|---|---|
| 4,751,410 | 6/1988 | Tanizawa | 307/576 |
| 4,827,159 | 5/1989 | Naganuma | 307/594 |
| 4,906,867 | 3/1990 | Petty | 307/451 |
| 4,924,120 | 5/1990 | Schenck | 307/443 |
| 4,961,010 | 10/1990 | Davis | 307/443 |
| 4,985,646 | 1/1991 | Kumagi | 307/594 |
| 5,010,256 | 4/1991 | Dicke | 307/443 |
| 5,036,222 | 7/1991 | Davis | 307/443 |
| 5,049,763 | 9/1991 | Rogers | 327/443 |

OTHER PUBLICATIONS

U.S. Patent Application Ser. No. 483,927 filed Feb. 22, 1990 now Patent No. 5,081,374.

*Primary Examiner*—Edward P. Westin
*Assistant Examiner*—Andrew Sanders
*Attorney, Agent, or Firm*—Daniel H. Kane; James W. Rose

[57] ABSTRACT

CMOS output circuit improvements control output signal rise and fall times during transition between high and low potential levels at the output ($V_{OUT}$). A plurality of pulldown predriver resistors ($R1_N$, $R2_N$, $R3_N$) are coupled in parallel paths in the pulldown predriver circuit. Respective resistance values slow turn on of the output pulldown driver transistor (N1) for achieving a plurality of different fall times. A plurality of pulldown predriver switch transistors (PS1, PS2, PS3) are respectively coupled in series with the pulldown predriver resistors ($R1_N$, $R2_N$, $R2_N$). The switch transistors (PS1, PS2, PS3) have respective control inputs ($V_{S1}$, $V_{S2}$, $V_{S3}$) for selecting respective parallel paths containing the different pulldown predriver resistors ($R1_N$, $R2_N$, $R3_N$). A plurality of pullup predriver resistors ($R1_P$, $R2_P$, $R3_P$) are coupled in parallel paths in the pullup predriver circuit. Respective resistance values slow turn on of the output pullup driver transistor (P1) for achieving a plurality of different rise times. A plurality of pullup predriver switch transistors (NS1, NS2, NS3) are coupled respectively in series with the pullup predriver resistors ($R1_P$, $R2_P$, $R3_P$). The switch transistors (NS1, NS2, NS3) are coupled to the respective switch transistor control inputs ($V_{S1}$, $V_{S2}$, $V_{S3}$) for selecting respective parallel paths of the pullup predriver resistors ($R1_P$, $R2_P$, $R3_P$). Different rise and fall times are selected by digital addressing for the output signal transitions between low to high potential levels at the output ($V_{OUT}$).

8 Claims, 5 Drawing Sheets

SELECTABLE EDGE RATE CMOS OUTPUT BUFFER CIRCUIT

TECHNICAL FIELD

This invention relates to a new CMOS output buffer circuit with different selectable rise and fall times for output signal transition between low and high potential levels at the output. An edge rate control circuit with alternative parallel paths is incorporated in the CMOS output buffer circuit and is digitally addressed for selecting paths corresponding to different specified output signal rise and fall times. The invention is particularly applicable to high speed, high drive CMOS output buffer circuits for selectively reducing output signal edge rate. The invention thereby reduces electromagnetic interference/radio frequency interference (EMI/RFI) noise from the output buffer circuit while monitoring high static drive capability for large fanout.

BACKGROUND ART

A conventional CMOS output buffer circuit having an output $V_{OUT}$ for delivering output signals of high and low potential levels in response to data signals at the input $V_{IN}$ is illustrated in FIG. 1. An output pullup driver transistor P1 sources current to the output $V_{OUT}$ from a high potential rail $V_{CC}$. An output pulldown driver transistor N1 sinks current from the output $V_{OUT}$ to a low potential rail GND. A pullup predriver circuit in the form of inverter stage P2, N2 is coupled to a gate node of the output pullup driver transistor P1 for controlling the conducting state of P1 in response to data signals at the input $V_{IN}$. A pulldown predriver circuit in the form of inverter stage P3, N3 is coupled to a gate node of the output pulldown driver transistor N1 for controlling the conducting state of transistor N1 in response to data signals at the input $V_{IN}$.

The CMOS output buffer circuit of FIG. 1 is a tristate output circuit with a tristate enable signal input OE. The tristate enable signal input $\overline{OE}$ is coupled directly to pulldown predriver tristate transistors P5, N5 and through inverter I4 to pullup predriver tristate transistors P4, N4. With the $\overline{OE}$ signal low (OE signal high) the tristate output enable circuit does not interfere in the normal operation of the pullup and pulldown predriver circuits. The output pullup and pulldown driver transistors and output $V_{OUT}$ therefore operate in the normal bistate mode. With $\overline{OE}$ signal high (OE signal low) the output pullup and pulldown driver transistors P1, N1 are disabled and present a high impedance at the output $V_{OUT}$.

The rise and fall times for output signal transitions between high and low potential levels at the output $V_{OUT}$ are functions of the size of the respective output pullup and pulldown driver transistors P1, N1, the speed of switching or driving of the output driver transistors P1, N1 by the respective pullup and pulldown predriver circuits, and the size of the load capacitance being charged or discharged at the output $V_{OUT}$. Typically the edge rates or slew rates of output signals and the rise and fall times at the edges of the output signals are determined primarily by the sizes of the output pullup and pulldown transistors P1, N1 and the sizes of the pullup and pulldown predriver circuit transistors P2, N2, P3, N3. More recently, advanced CMOS output buffer circuits are characterized by high drive, high speed output signals with very fast edge rates. A variety of circuit techniques are used to control the transition time or edge rate of such output signals.

For example in the Jeffrey B. Davis U.S. Pat. No. 4,961,010, transition times and edge rates of output signals are controlled by bifurcated turn on of the output pullup and pulldown transistors for reducing switching induced noise. In the Davis U.S. patent application Ser. No. 483,927, filed Feb. 22, 1990, for OUTPUT BUFFER CIRCUIT WITH SIGNAL FEED FORWARD FOR REDUCING SWITCHING INDUCED NOISE, the transition time is prolonged and edge rate reduced by an initial early turn on of the output pullup and pulldown transistors using feed forward signals. In the Davis U.S. Pat. No. 5,036,222, the transition time at edges of the output signals is prolonged or not in response to the voltage sensed at the output. In the Alan c. Rogers U.S. Pat. No. 5,049,763 issued Sep. 17, 1991 for ANTI-NOISE CIRCUITS, turn on of the output driver transistors may be suppressed by an anti-noise transistor functioning as an active variable resistance coupled in the control gate path of the respective output driver transistor. The conductivity of the anti-noise transistor varies inversely with sensed power rail noise effectively controlling fall or rise times in response to the ground bounce or $V_{CC}$ droop in the power rails.

Feedback capacitors have also been used in linear buffer circuits to control slew rate. Such linear buffer circuits, however, are operational amplifiers with very slow edge rates in the order of micro-seconds ($\mu$S) and using feedback capacitance in the order of micro-farads ($\mu$F). To applicant's knowledge, feedback capacitors have not been used to control edge rate in high speed switching digital circuits and using feedback capacitance many orders of magnitude smaller in the pico-farad (pF) range. Nor have digitally addressable and selectable edge rate control circuits been incorporated in such digital circuits.

OBJECTS OF THE INVENTION

It is an object of the present invention to provide a CMOS output buffer circuit with different selectable rise and fall times for output signal transition between high and low potential levels at the output. The invention is particularly intended for high speed switching, high drive digital output buffer circuits.

Another object of the invention is to provide a digitally addressable edge rate control circuit for selecting different transition times at the edges of output signals according to the application for example for minimizing EMI/RFI noise from the output buffer circuit.

A further object of the invention is to provide the CMOS output buffer circuit with selectable different rise and fall times while maintaining high static drive capability for driving a large fanout.

DISCLOSURE OF THE INVENTION

In order to accomplish these results, the invention provides at least one pulldown predriver resistor coupled in the pulldown predriver stage. The resistance value of the pulldown predriver resistor is selected for slowing turn on of the output pulldown driver for controlling the fall time for an output signal transition from high to low potential level at the output. A separate pulldown feedback capacitor may also be coupled between the output and a control gate node of the output pulldown driver. The capacitance value of the pulldown feedback capacitor is selected to afford a desired RC time constant in cooperation with a pulldown predriver resistor for slowing turn on of the output pulldown driver.

According to the invention, the output buffer circuit may also incorporate at least one pullup predriver resistor coupled in the pullup predriver stage. The resistance value of the pullup predriver resistor is selected for slowing turn on of the output pullup driver for controlling the rise time for an output signal transition from low to high potential level at the output. A separate pullup feedback capacitor may be coupled between the output and a control gate node of the output pullup driver. The capacitance value of the pullup feedback capacitor is selected to afford a desired RC time constant in cooperation with a pullup predriver resistor for slowing turn on of the output pullup driver.

In the preferred example embodiments, the invention provides a plurality of at least first and second pulldown predriver resistors coupled in parallel paths in the pulldown predriver circuit. The pulldown predriver resistors have respective resistance values selected for slowing turn on of the output pulldown driver transistor and for achieving a plurality of at least first and second different fall times for output signal transition from high to low potential level at the output. A plurality of at least first and second pulldown predriver switch transistors are coupled in series with the pulldown predriver resistors. The switch transistors have respective switch transistor control inputs for selecting respective parallel paths of the pulldown predriver resistors by digital addressing. Different fall times can therefore be selected for output signal transition from high to low potential level at the output.

The invention also provides a plurality of at least first and second pullup predriver resistors coupled in parallel paths in the pullup predriver circuit. The pullup predriver resistors also have respective resistance values selected for slowing turn on of the output pullup driver transistor and for achieving a plurality of at least first and second different rise times for output signal transition from low to high potential at the output. A plurality of at least first and second pullup predriver switch transistors are respectively coupled in series with the pullup predriver resistors. The switch transistors are coupled to the respective switch transistor control inputs for selecting respective parallel paths of the pullup predriver resistors also by digital addressing. Different rise times may therefore be selected for the output signal transition from low to high potential level at the output.

According to the preferred example embodiment, the plurality of pulldown predriver resistors comprises first, second and third pulldown predriver resistors coupled in parallel paths with first, second and third switch transistors having first, second and third switch transistor control inputs. The resistor values are selected to afford first, second, and third different fall times having respective values in a binary power ratio sequence.

Similarly the plurality of pullup predriver resistors comprises first, second, and third pullup predriver resistors coupled in parallel paths with first, second and third switch transistors coupled respectively to the first, second and third switch transistor control inputs. The resistor value values are selected to afford first, second, and third different rise times with respective time values in a binary power ratio sequence.

In the preferred example the CMOS output buffer circuit is constructed with a tristate enable circuit coupled to the pullup and pulldown predriver circuits and having a tristate enable input for implementing a high impedance third state at the output. The tristate enable circuit includes a tristate pullup transistor having source and drain nodes coupled in parallel with the pullup predriver circuit pullup transistor. A tristate pulldown transistor is coupled with source and drain nodes in parallel with the pulldown predriver circuit pulldown transistor. Furthermore, the tristate enable circuit makes use of the pullup and pulldown predriver switch transistors and respective switch transistor control inputs. The control inputs are addressed for blocking the predriver resistor parallel paths to the low and high potential power rails in the high impedance third state.

A pullup feedback capacitor may be coupled between the output and gate node of the output pullup driver transistor. The pullup feedback capacitor is provided with a specified capacitance value for slowing turn on of the output pullup predriver transistor. The pullup feedback capacitor augments the gate capacitance of the output pullup driver transistor and cooperates with the selected pullup predriver resistor for achieving the desired rise time for output signal transition from low to high potential level at the output.

A pulldown feedback capacitor may also be coupled between the output and gate node of the output pulldown driver transistor. The capacitance value of the pulldown feedback capacitor is selected for slowing turn on of the output pulldown driver transistor. The pulldown feedback capacitance augments the gate capacitance of the output pulldown driver transistor and cooperates with the selected pulldown predriver resistor for achieving the desired fall time for output signal transition from high to low potential level at the output.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
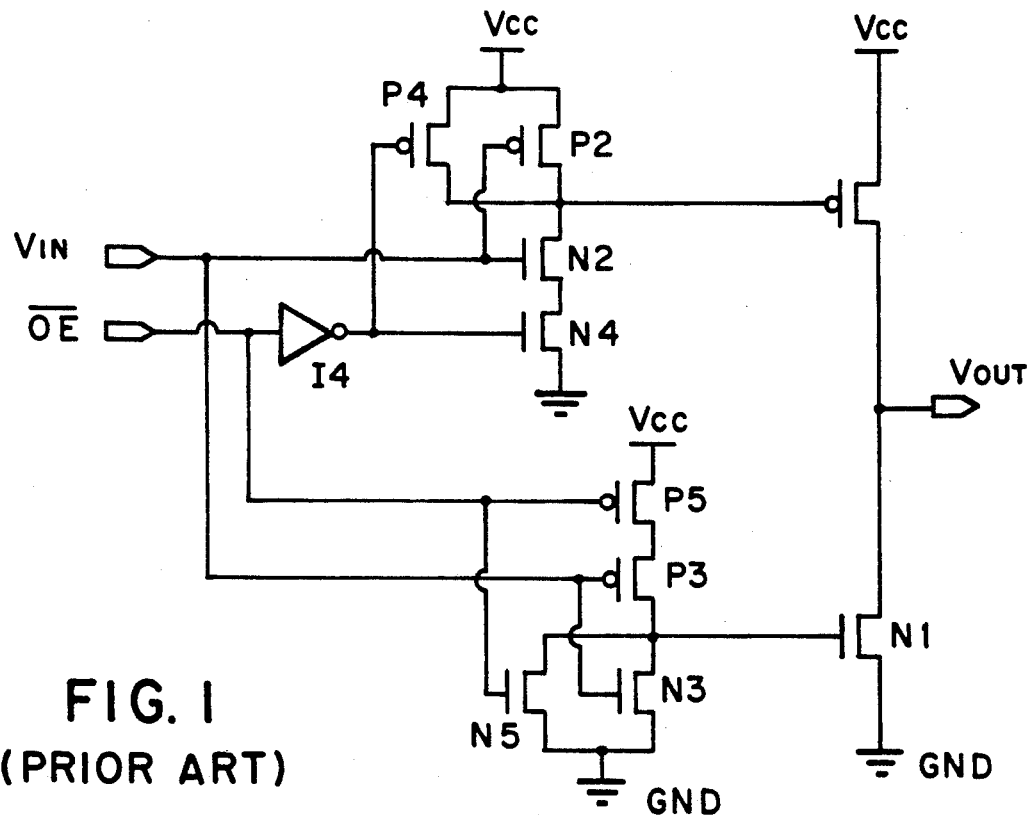
FIG. 1 is a schematic circuit diagram of a standard prior art CMOS output buffer circuit.
Figure 2:
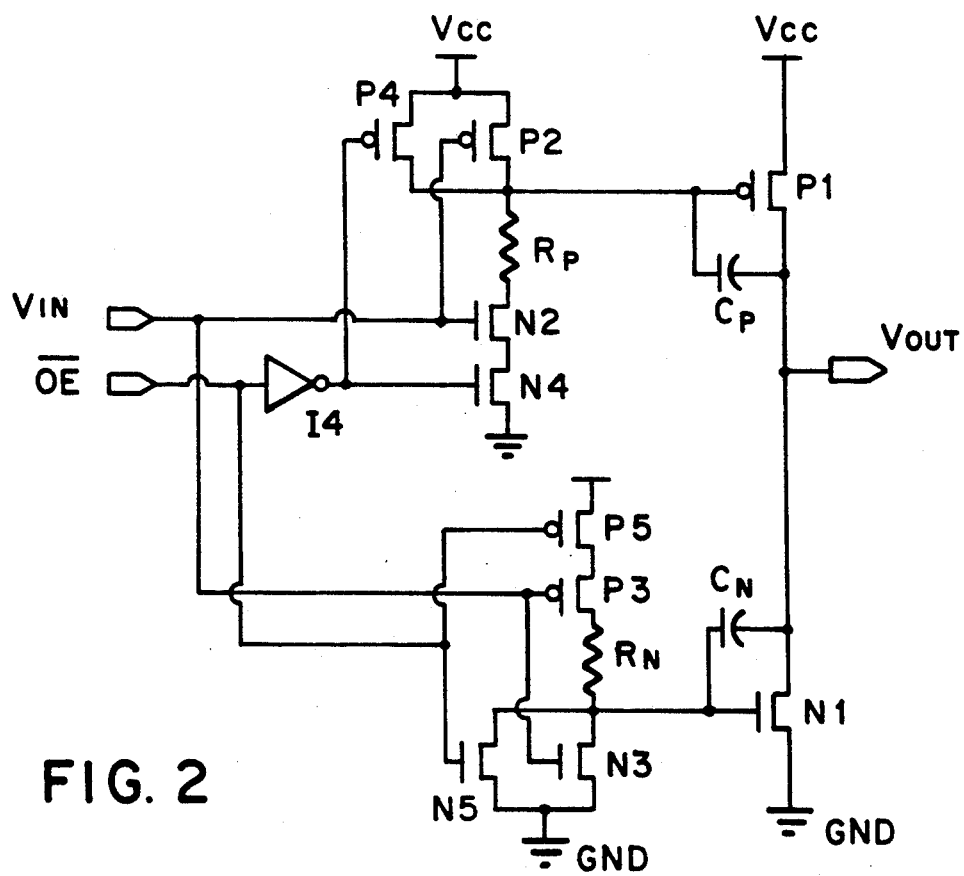
FIG. 2 is a schematic circuit diagram of an output buffer circuit with controlled edge rate according to the invention.

A CMOS output buffer circuit with controlled edge rate according to the invention is illustrated in FIG. 2. Circuit components performing the same or similar function as the circuit components of FIG. 1 are indicated by the same reference designations. In addition to these common components, in the circuit of FIG. 2, a pullup feedback capacitor $C_P$ is coupled between the output $V_{OUT}$ and the gate node of the output pullup driver transistor P1. The pullup feedback capacitor $C_P$ has a selected capacitance value for slowing turn on of output pullup predriver transistor P1. By way of example, for a pullup driver transistor P1 having a gate width or channel width of 3600μ, a $C_P$ capacitance value of 1.7 pF may be used to augment the gate capacitance and effective Miller feedback capacitance of P1.

A pulldown feedback capacitor $C_N$ is coupled between the output $V_{OUT}$ and the gate node of output pulldown driver transistor N1. For a pulldown driver transistor N1 having channel width of 1600μ, a $C_N$ capacitance value of 1.7 pF may similarly be used to augment the gate capacitance and effective Miller feedback capacitance of N1 for slowing turn on of N1. The pullup and pulldown feedback capacitors $C_P$, $C_N$ act as a transient voltage clamp on the ramping of gate to source voltage $V_{GS}$ of the respective output transistors during the switching interval. The ramping of the voltage $V_{GS}$ is flattened during transition, slowing turn on of the respective output transistors.

A pullup predriver resistor $R_P$ is added to the pullup predriver circuit and is coupled in series with the predriver pulldown transistor N2 between the gate node of P1 and the low potential power rail GND. The resistance value of pullup predriver resistor $R_P$ is selected for slowing turn on of P1 and for achieving a specified rise time for output signal transition from low to high potential level at the output $V_{OUT}$ in cooperation with pullup feedback capacitor $C_p$. Example values for pullup predriver resistor $R_P$ are discussed hereafter with reference to TABLE II.

A pulldown predriver resistor $R_N$ is added to the pulldown predriver circuit and is coupled in series with the predriver pullup transistor P3 between the gate node of N1 and the high potential power rail $V_{CC}$. The resistance value of pulldown predriver resistor $R_n$ is selected for slowing turn on of N1 and for achieving a specified fall time for output signal transition from high to low potential level at the output $V_{OUT}$ in cooperation with pulldown feedback capacitor $C_n$. It is noted that the pullup and pulldown predriver resistors $R_P$, $R_n$ form RC circuits with the respective feedback capacitors $C_P$, $C_N$ and the respective gate capacitances of P1, N1 for a desired characteristic rising edge or falling edge time constant.

Figure 3:
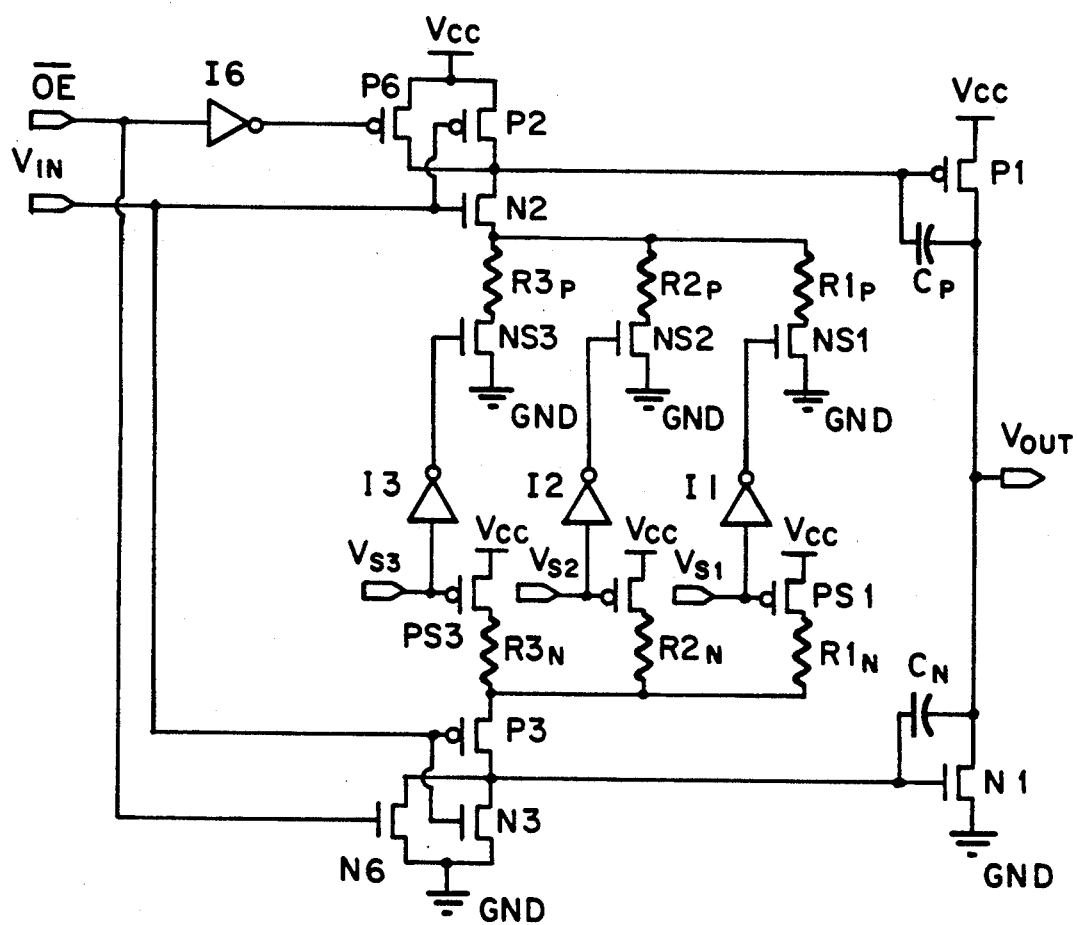
FIG. 3 is a schematic circuit diagram of the selectable edge rate CMOS output buffer circuit with an edge rate control circuit which is digitally addressed for selecting different specified output signal rise and fall times.

In the preferred embodiment of FIG. 3 a plurality of pullup predriver resistors, in this example $R1_P$, $R2_P$, and $R3_P$ are coupled in parallel paths in the pullup predriver circuit in series with pullup predriver pulldown transistor N2. Different resistance values are selected for the pullup predriver resistors for achieving a plurality of first, second and third different rise times for output signal transition from low to high potential level at the output $V_{OUT}$. Predriver switch transistors NS1, NS2, NS3 are respectively coupled in series with pullup predriver resistors $R1_P$, $R2_P$, $R3_P$. Control inputs $V_{S1}$, $V_{S2}$, $V_{S3}$ coupled respectively to switch transistors NS1, NS2, NS3 through inverter stages I1, I2, I3 permit digital addressing of the switch transistors for selecting respective parallel paths of the pullup predriver resistors. One of the plurality of different available rise times is thereby selected for the output signal transition from low to high potential level at the output.

A plurality of pulldown predriver resisters, in this example, $R1_N$, $R2_N$, $R3_N$ are coupled in parallel paths in the pulldown predriver circuit in series with the pulldown predriver pullup transistor P3. The resistance values of the pulldown predriver resisters are selected to provide a plurality of first, second and third different fall times for output signal transition from high to low potential level at output $V_{OUT}$.

Pulldown predriver switch transistors PS1, PS2, PS3 are coupled in series with respective pulldown predriver resisters $R1_n$, $R2_n$, $R3_n$. The gate nodes of switch transistors PS1, PS2, PS3 are coupled directly to the control inputs $V_{S1}$, $V_{S2}$, $V_{S3}$ for selecting respective parallel paths of the pulldown predriver resistors for selecting one of the different fall times for output signal transition from high to low potential level at the output $V_{OUT}$.

It is apparent as shown in FIGS. 2 and 3 that the pullup and pulldown predriver resistors are coupled in series with the primary current path of the respective predriver pullup and pulldown transistors. That is, the pullup and pulldown predriver resistors are coupled in the source/drain current paths of the respective predriver pullup and pulldown transistors rather than in a control gate path. The predriver switch transistors are similarly coupled in the primary source/drain paths of the respective predriver pullup or pulldown transistor primary current paths.

An example set of codes for addressing the respective control inputs $V_{S1}$, $V_{S2}$, $V_{S3}$ for selecting different edge rates or rise and fall times for the CMOS output buffer circuit of FIG. 3 is set forth in TABLE I. Because of the inverter stages I1, I2, I3, the active path of the predriver resistor parallel paths is selected by the active low input at the control inputs $V_{S1}$, $V_{S2}$, $V_{S3}$.

It is also apparent from TABLE I that the switch transistors NS1, NS2, NS3, PS1, PS2, PS3 of the selectable edge rate CMOS output buffer circuit of FIG. 3 are also used as part of the tristate enable circuit. The tristate enable input OE is coupled through inverter stage I6 to tristate pullup transistor P6 coupled in parallel with the pullup predriver circuit pullup transistor P2. The tristate enable input OE is also coupled directly to tristate pulldown transistor N6 coupled in parallel with the pulldown predriver circuit pulldown transistor N3. The tristate transistors P6, N6 form part of the disabling circuit for implementing the high impedance third state at output $V_{OUT}$.

The switch transistors complete the tristate enable circuitry by blocking paths from the gate nodes of output pullup and pulldown transistors P1, N1 to the respective power rails GND, $V_{CC}$.

TABLE I

|  | OE | $V_{S1}$ | $V_{S2}$ | $V_{S3}$ |
|---|---|---|---|---|
| SLOW | 0 | 0 | 1 | 1 |
| MED | 0 | 1 | 0 | 1 |
| FAST | 0 | 1 | 1 | 0 |
| TRISTATE | 1 | 1 | 1 | 1 |

An example set of values for the operative components of the circuit of FIG. 3 is set forth in TABLES II and III. Typical values for the gate widths or channel widths of the operative transistors for a high drive, high speed CMOS output buffer circuit are set forth in TABLE II. For this example set of transistor sizes, appropriate values for the predriver resistors and feedback capacitors are set forth in TABLE III. These values produce rise and fall times for the respective three parallel paths of 1.2 nS for the R1 paths, 2 nS for the R2 paths, and 4.5 nS for the R3 paths. The preferred example values thus give first, second and third different fall times or rise times having respective values in a binary power ratio sequence of approximately 1:2:4.

TABLE II

| MOS Transistor | Example Channel Width |
| --- | --- |
| P1 | 3600μ |
| N1 | 1600μ |
| P2 | 400μ |
| N2 | 290μ |
| P3 | 300μ |
| N3 | 200μ |
| PS1 | 300μ |
| PS2 | 300μ |
| PS3 | 300μ |
| NS1 | 290μ |
| NS2 | 290μ |
| NS3 | 290μ |
| P6 | 200μ |
| N6 | 80μ |

TABLE III

| Resistor/Capacitor | Example Values |
| --- | --- |
| R1$_P$ | 28 Ω |
| R2$_P$ | 145 Ω |
| R3$_P$ | 540 Ω |
| R1$_N$ | 55 Ω |
| R2$_N$ | 250 Ω |
| R3$_N$ | 1070 Ω |
| C$_P$ | 1.7 pF |
| C$_N$ | 1.7 pF |

Figure 4:
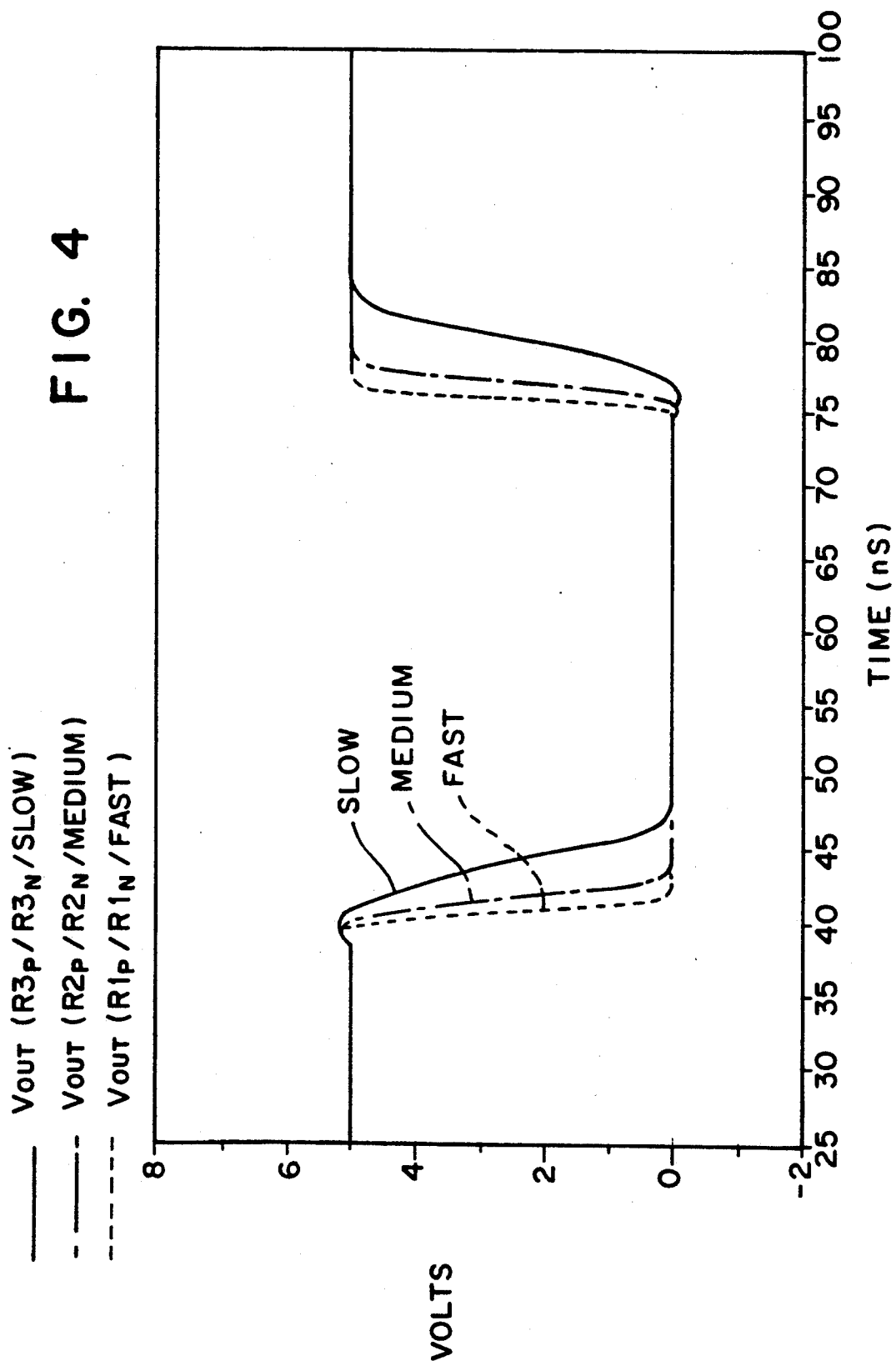
FIG. 4 is a graph of the output signal voltages versus time at the output node $V_{OUT}$ for three different edge rates and rise and fall times corresponding to the three different predriver resistor parallel paths for the CMOS output buffer circuit of FIG. 3.
Figure 5:
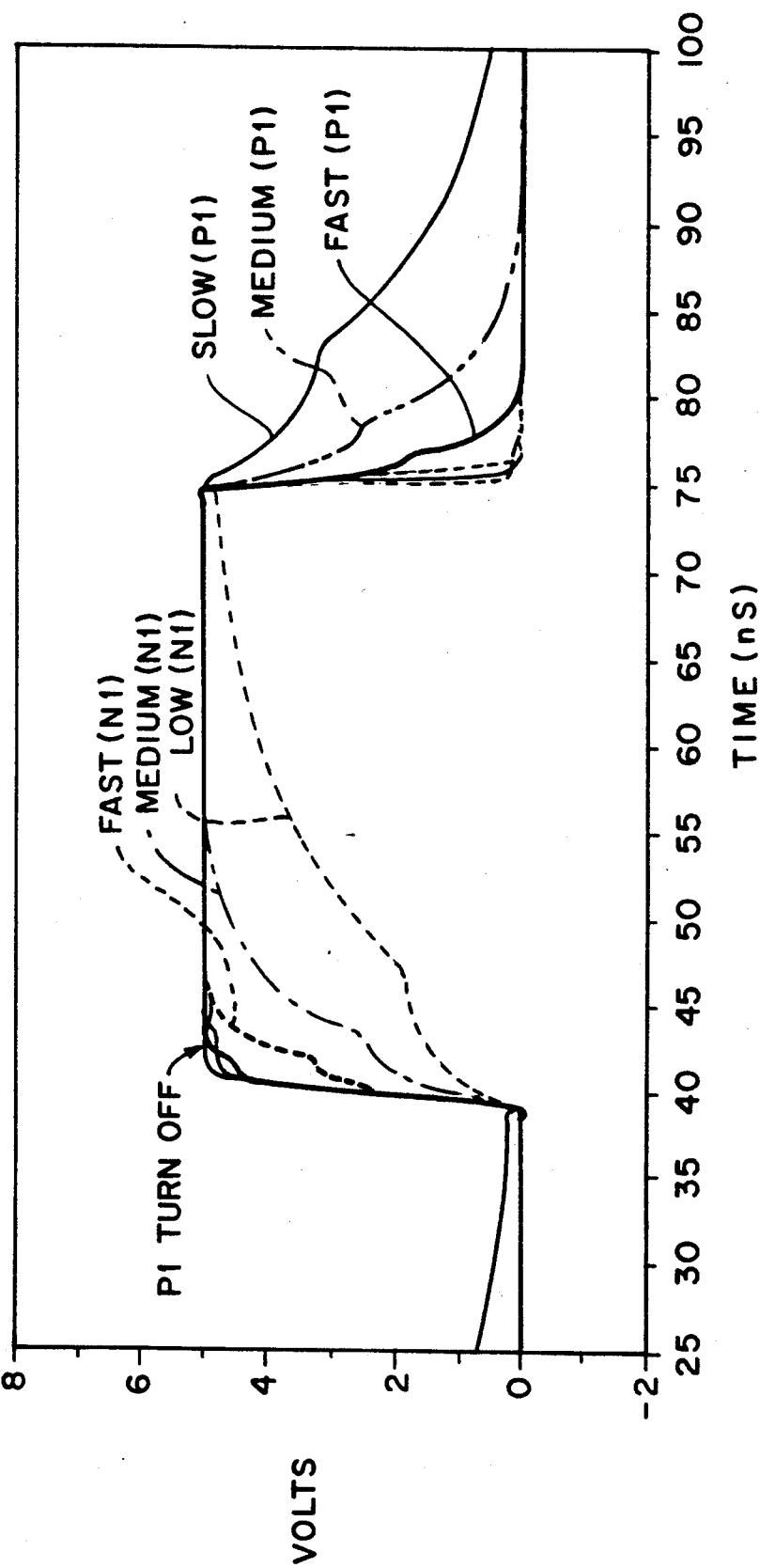
FIG. 5 is a graph of gate node voltages versus time at the gate nodes of the respective pullup and pulldown driver transistors P1, N1 for the three different edge rates and corresponding rise and fall times for the fast, medium and slow predriver resistor parallel paths.
Figure 6:
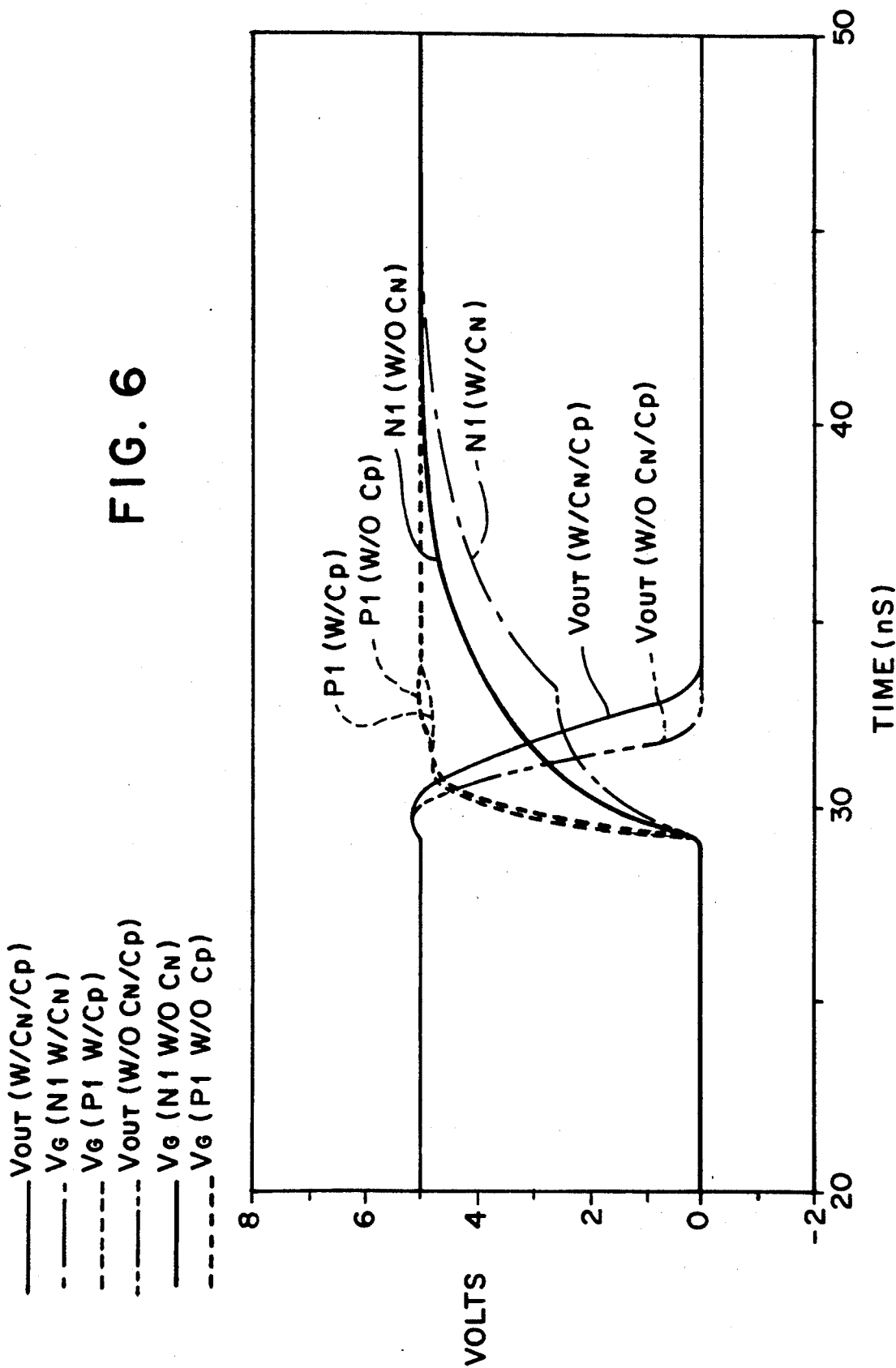
FIG. 6 is a graph of signal voltages versus time at the gate nodes of the respective output pullup and pulldown driver transistors P1, N1 and at the output node $V_{OUT}$ with a fixed resistor value according to the circuit of FIG. 1 and both with and without the pullup and pulldown feedback capacitors $C_P$, $C_N$.

The operation of the circuit of FIG. 3 is further illustrated in the graphs of FIGS. 4, 5, and 6. Graphs of the output voltage signals at the output node V$_{OUT}$ according to the selected predriver resistor paths are illustrated in FIG. 4. Selection of the R3 paths selects the SLOW edge rate and transition time of approximately 4.5 nS. Selection of the R2 paths selects the MEDIUM edge rate with transition times of approximately 2 nS. Selection of the R1 predriver resistor paths selects the FAST edge rate with transition times of approximately 1.2 nS.

The corresponding voltage signals V$_G$ at the gate nodes of the output pullup and pulldown driver transistors P1, N1 are illustrated in the graph of FIG. 5. It is apparent from the graph of FIG. 5 that while one of the output driver transistors is active and turning on, the edge rate control circuitry of the present invention does not affect turn off of the other inactive driver transistor. Thus, the respective predriver resisters are positioned in the respective predriver circuits so that they effect only the turn on of the output driver transistors and not the turn off of the output driver transistors.

The effect of the feedback capacitors C$_P$, C$_N$ alone is illustrated in the graph of FIG. 6 for the falling transition from high to low potential level at the output node V$_{OUT}$. The difference between the gate voltages V$_G$ at the gate node of pulldown predriver transistor N1 both with and without the feedback capacitor C$_N$ is graphically illustrated. The effect on the falling edge rate of the output voltage signal at the output node V$_{OUT}$ both with and without the feedback capacitors is also apparent. On the other hand for the inactive output pullup transistor P1 there is no substantial effect on the turn off of P1.

In the example of FIG. 3, the selectable edge rate CMOS output buffer circuit can be constructed without the separate augmenting feedback capacitors C$_p$, C$_N$. The gate capacitances of output pullup and pulldown transistors P1, N1 are then selected to achieve the desired results in cooperation with the selected pullup and pulldown predriver resistors.

While the invention has been described with reference to particular example embodiments it is intended to cover all modifications and equivalents within the scope of the following claims.

I claim:

1. A CMOS tristate output buffer circuit having an output pullup driver (P1) and an output pulldown driver (N1) coupled to an output (V$_{OUT}$), a pullup predriver stage (P2, N2) coupled to the output pullup driver, and a pulldown predriver stage (P3, N3) coupled to the output pulldown driver, comprising:

a plurality of pulldown predriver resistors (R1$_N$, R2$_N$, R3$_N$) coupled in parallel paths in the pulldown predriver stage and having different resistance values selected for slowing turn on of the output pulldown driver with different selected fall times for output signal transitions from high and low potential level at the output (V$_{OUT}$);

a plurality of pulldown predriver switch elements (PS1, PS2, PS3) respectively coupled in series with the respective pulldown predriver resistors (R1$_N$, R2$_N$, R3$_N$), said switch elements having respective digital logic addressing control signal inputs (V$_{S1}$, V$_{S2}$, V$_{S3}$) for selecting by digital logic addressing respective pulldown predriver resistor parallel paths and corresponding fall times;

a plurality of pullup predriver resistors (R1$_p$, R2$_p$, R3$_p$) coupled in parallel paths in the pullup predriver stage and having different resistance values selected for slowing turn on of the output pullup driver with different selected rise times for output signal transitions from low to high potential level at the output (V$_{OUT}$);

a plurality of pullup predriver switch elements (NS1, NS2, NS3) respectively coupled in series with the respective pullup predriver resistors (R1$_p$, R2$_p$, R3$_p$), said switch elements having respective digital logic addressing control signal inputs (V$_{S1}$, V$_{S2}$, V$_{S3}$) for selecting by digital logic addressing respective pullup predriver resistor parallel paths and corresponding rise times;

a tristate enable circuit (I6, P6, N6) coupled to the pullup predriver circuit (P2, N2) and pulldown predriver circuit (P3, N3) and having a tristate enable input ($\overline{OE}$) for implementing a high impedance third state at the output (V$_{OUT}$), said tristate enable circuit comprises a tristate pullup transistor (P6) having source and drain nodes coupled in parallel with the pullup predriver circuit pullup transistor (P2), a tristate pulldown transistor (N6) having source and drain nodes coupled in parallel with the pulldown predriver circuit pulldown transistor (N3), and an inverter stage (I6) coupling the tristate pullup transistor (P6) to the tristate enable input ($\overline{OE}$), said tristate enable circuit further comprising the pullup and pulldown predriver switch transistors (NS1, NS2, NS3, PS1, PS2, PS3) and respective switch transistor control inputs ($V_{S1}$, $V_{S2}$, $V_{S3}$) for blocking the respective predriver resistor parallel paths to the low and high potential power rails (GND, $V_{CC}$) in the high impedance third state according to said digital logic addressing of the respective switch transistor control inputs.

2. The output buffer circuit of claim 1 comprising:
a pulldown feedback capacitor ($C_N$) coupled between the output and a control gate node of the output pulldown driver (N1), said pulldown feedback capacitor having a capacitance value selected to afford a desired RC time constant in cooperation with a pulldown predriver resistor ($R_N$) for slowing turn on of the output pulldown driver.

3. The output buffer circuit of claim 1 comprising:
a pullup feedback capacitor ($C_P$) coupled between the output and a control gate node of the output pullup driver (P1), said pullup feedback capacitor having a capacitance value selected to afford a desired RC time constant in cooperation with a pullup predriver resistor ($R_P$) for slowing turn on of the output pullup driver.

4. A method of controlling edge rates for transitions between high and low potential levels at the output of a tristate output buffer circuit having an output pullup driver, output pulldown driver, pullup predriver stage coupled to the output pullup driver, and pulldown predriver stage coupled to the output pulldown driver, comprising:
interposing a plurality of different pulldown predriver resistors in alternative parallel paths in the pulldown predriver stage;
selecting and switching between said different alternative parallel paths of different pulldown predriver resistors by digital logic addressing for slowing turn on of the output pulldown driver with different selected fall times for output signal transitions from high to low potential level at the output;
interposing a plurality of different pullup predriver resistors in alternative parallel paths in the pullup predriver stage;
selecting and switching between said different alternative parallel paths of the different pullup predriver resistors by digital logic addressing for slowing turn on of the output pullup driver with different selected rise times for output signal transitions from low to high potential level at the output;
incorporating a tristate enable circuit (I6, P6, N6) and tristate enable input ($\overline{OE}$) in the tristate output buffer circuit;
and implementing a high impedance third state at the output ($V_{OUT}$) of the tristate output buffer circuit by controlling the different alternative parallel paths of the different pullup and pulldown predriver resistors ($R1_P$, $R2_P$, $R3_P$, $R1_N$, $R2_N$, $R3_N$) by digital logic addressing in coordination with the tristate enable circuit and tristate enable input ($\overline{OE}$).

5. A CMOS tristate output buffer circuit having an output ($V_{OUT}$) for delivering output signals of high and low potential levels in response to data signals at an input ($V_{IN}$), an output pullup driver transistor (P1) for sourcing current to the output ($V_{OUT}$) from a high potential rail ($V_{CC}$), an output pulldown driver transistor (N1) for sinking current from the output ($V_{OUT}$) to a low potential rail (GND), a pullup predriver circuit (P2, N2) coupled to a gate node of the output pullup driver transistor (P1), a pulldown predriver circuit (P3, N3) coupled to a gate node of the output pulldown driver transistor (N1), the improvement for controlling output signal rise and fall times during transition between high and low potential levels at the output ($V_{OUT}$) comprising:

a plurality of at least first and second pulldown predriver resistors ($R1_N$, $R2_N$, $R3_N$) coupled in parallel paths in the pulldown predriver circuit and having respective resistance values for slowing turn on of the output pulldown driver transistor (N1) for achieving a plurality of at least first and second different fall times for output signal transition from high to low potential level at the output ($V_{OUT}$);

a plurality of at least first and second pulldown predriver switch transistors (PS1, PS2, PS3) respectively coupled in series with the pulldown predriver resistors ($R1_N$, $R2_N$, $R3_N$), said switch transistors (PS1, PS2, PS3) having respective switch transistor control inputs ($V_{S1}$, $V_{S2}$, $V_{S3}$) for selecting by digital logic addressing respective parallel paths of the pulldown predriver resistors ($R1_N$, $R2_N$, $R3_N$) thereby selecting one of the different fall times for the output signal transition from high to low potential level at the output ($V_{OUT}$);

a plurality of at least first and second pullup predriver resistors ($R1_P$, $R2_P$, $R3_P$) coupled in parallel paths in the pullup predriver circuit and having respective resistance values for slowing turn on of the output pullup driver transistors (P1) for achieving a plurality of at least first and second different rise times for output signal transition from low to high potential at the output ($V_{OUT}$);

a plurality of at least first and second pullup predriver switch transistors (NS1, NS2, NS3) respectively coupled in series with the pullup predriver resistors ($R1_P$, $R2_P$, $R3_P$), said switch transistors (NS1, NS2, NS3) having respective switch transistor control inputs ($V_{S1}$, $V_{S2}$, $V_{S3}$) for selecting by digital logic addressing respective parallel paths of the pullup predriver resistors ($R1_P$, $R2_P$, $R3_P$) thereby selecting one of the different rise times for the output signal transition from low to high potential level at the output ($V_{OUT}$); and a tristate enable circuit (I6, P6, N6) coupled to the pullup predriver circuit (P2, N2) and pulldown predriver circuit (P3, N3) and having a tristate enable input ($\overline{OE}$) for implementing a high impedance third state at the output ($V_{OUT}$), said tristate enable circuit comprises a tristate pullup transistor (P6) having source and drain nodes coupled in parallel with the pullup predriver circuit pullup transistor (p2), a tristate pulldown transistor (N6) having source and drain nodes coupled in parallel with the pulldown predriver circuit pulldown transistor (N3), and an inverter stage (I6) coupling the tristate pullup transistor (P6) to the tristate enable input ($\overline{OE}$), said tristate enable circuit further comprising the pullup and pulldown predriver switch transistors (NS1, NS2, NS3, PS1, PS2, PS3) and respective switch transistor control inputs ($V_{S1}$, $V_{S2}$, $V_{S3}$) for blocking the respective predriver resistor parallel paths to the low and high potential power rails (GND, $V_{CC}$) in the high impedance third state according to the digital logic addressing of the respective switch transistor control inputs.

6. The CMOS output buffer circuit of claim 5 wherein the plurality of pulldown predriver resistors comprises first, second and third pulldown predriver resistors ($R1_N$, $R2_N$, $R3_N$) coupled in parallel paths, the plurality of pulldown predriver switch transistors comprises first, second and third switch transistors (PS1, PS2, PS3) with first, second and third switch transistor control inputs ($V_{S1}$, $V_{S2}$, $V_{S3}$), and wherein the resistor values are selected to afford first, second and third different fall times having respective values in a binary power ratio sequence of approximately 1:2:4.

7. The CMOS output buffer circuit of claim 6 wherein the plurality of pullup predriver resistors comprises first, second, and third pullup predriver resistors ($R1_P$, $R2_P$, $R3_P$) coupled in parallel paths, the plurality of pullup predriver switch transistors comprises first, second and third switch transistors (NS1, NS2, NS3) with first, second and third switch transistor control inputs ($V_{S1}$, $V_{S2}$, $V_{S3}$), and wherein the resistor values are selected to afford first, second and third different rise times having respective time values in a binary power ratio sequence of approximately 1:2:4.

8. A CMOS tristate output buffer circuit having an output ($V_{OUT}$) for delivering output signals of high and low potential levels in response to data signals at an input ($V_{IN}$), an output pullup driver transistor (P1) for sourcing current to the output ($V_{OUT}$) from a high potential rail ($V_{CC}$), an output pulldown driver transistor (N1) for sinking current from the output ($V_{OUT}$) to a low potential rail (GND), a pullup predriver circuit (P2, N2) coupled to a gate node of the output pullup driver transistor (P1), a pulldown predriver circuit (P3, N3) coupled to a gate node of the output pulldown driver transistor (N1), the improvement for controlling output signal rise and fall times during transition between high and low potential levels at the output ($V_{OUT}$) comprising:

- a pulldown feedback capacitor ($C_N$) coupled between the output ($V_{OUT}$) and gate node of the output pulldown driver transistor (N1), said pulldown feedback capacitor ($C_N$) having a specified capacitance value for slowing turn on of the output pulldown driver transistor (N1);
- a plurality of at least first and second pulldown predriver resistors ($R1_N$, $R2_N$, $R3_N$) coupled in parallel paths in the pulldown predriver circuit and having respective resistance values for slowing turn on of the output pulldown driver transistor (N1) for achieving a plurality of at least first and second different fall times for output signal transition from high to low potential level at the output ($V_{OUT}$) in cooperation with the pulldown feedback capacitor ($C_N$);
- a plurality of at least first and second pulldown predriver switch transistors (PS1, PS2, PS3) respectively coupled in series with the pulldown predriver resistors ($R1_N$, $R2_N$, $R3_N$), said switch transistors (PS1, PS2, PS3) having respective digital logic addressing control inputs ($V_{S1}$, $V_{S2}$, $V_{S3}$) for selecting respective parallel paths of the pulldown predriver resistors ($R1_N$, $R2_N$, $R3_N$) thereby selecting one of the different fall times for the output signal transition from high to low potential level at the output ($V_{OUT}$);
- a pullup feedback capacitor ($C_P$) coupled between the output ($V_{OUT}$) and gate node of the output pullup driver transistor (P1), said pullup feedback capacitor ($C_P$) having a specified capacitance value for slowing turn on of the output pullup predriver transistor (P1);
- a plurality of at least first and second pullup predriver resistors ($R1_P$, $R2_P$, $R3_P$) coupled in parallel paths in the pullup predriver circuit and having respective resistance values for slowing turn on of the output pullup driver transistor (P1) for achieving a plurality of at least first and second different rise times for output signal transition from low to high potential level at the output ($V_{OUT}$) in cooperation with the pullup feedback capacitor ($C_P$);
- a plurality of at least first and second pullup predriver switch transistors (NS1, NS2, NS3) respectively coupled in series with the pullup predriver resistors ($R1_P$, $R2_P$, $R3_P$), said switch transistors (NS1, NS2, NS3) having respective digital logic addressing control inputs ($V_{s1}$, $V_{s2}$, $V_{s3}$) for selecting respective parallel paths of the pullup predriver resistors ($R1_P$, $R2_P$, $R3_P$) thereby selecting one of the different rise times for the output signal transition from low to high potential level at the output ($V_{OUT}$);
- and a tristate enable circuit (I6, P6, N6) coupled to the pullup predriver circuit (P2, N2) and pulldown predriver circuit (P3, N3) and having a tristate enable input ($\overline{OE}$) for implementing a high impedance third state at the output ($V_{OUT}$), said tristate enable circuit comprising a tristate pullup transistor (P6) having source and drain nodes coupled in parallel with the pullup predriver circuit pullup transistor (P2), a tristate pulldown transistor (N6) having source and drain nodes coupled in parallel with the pulldown predriver circuit pulldown transistor (N3), an inverter stage (I6) coupling the tristate pullup transistor (P6) to the tristate enable input ($\overline{OE}$), said tristate enable circuit further comprising the pullup and pulldown predriver switch transistors (NS1, NS2, NS3, PS1, PS2, PS3) and respective switch transistor control inputs ($V_{S1}$, $V_{S2}$, $V_{S3}$) for blocking the respective predriver resistor parallel paths to the low and high potential power rails (GND, $V_{CC}$) in the high impedance third state according to the digital logic addressing at the respective switch transistor control inputs.

* * * * *